(12) United States Patent
Kobayashi (10) Patent No.: US 6,943,865 B2
(45) Date of Patent: Sep. 13, 2005

(54) DEVICE MANUFACTURING APPARATUS (75) Inventor: Kenichi Kobayashi, Tochigi (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 10/691,505

(22) Filed: Oct. 24, 2003

(65) Prior Publication Data
US 2004/0085524 A1 May 6, 2004

(30) Foreign Application Priority Data
Nov. 1, 2002 (JP) ........................................ 2002-320286

(51) Int. Cl.⁷ .......................... G03B 27/52; G03B 27/42
(52) U.S. Cl. .......................................... 355/30; 355/53
(58) Field of Search ........................ 355/30, 53, 72–76

(56) References Cited

U.S. PATENT DOCUMENTS

| | | | |
|---|---|---|---|
| 5,134,436 A | 7/1992 | Fujioka | 355/30 |
| 5,231,291 A | 7/1993 | Amemiya et al. | 250/443.1 |
| 5,499,076 A | 3/1996 | Muraki | 355/53 |
| 5,871,587 A | 2/1999 | Hasegawa et al. | 118/719 |
| 5,907,390 A | 5/1999 | Sakamoto | 355/30 |
| 6,133,982 A | 10/2000 | Inoue et al. | 355/30 |
| 6,226,073 B1 | 5/2001 | Emoto | 355/53 |
| 6,320,646 B1 | 11/2001 | Mouri | 355/53 |
| 6,370,793 B1 | 4/2002 | Chae et al. | 34/231 |
| 6,445,441 B1 | 9/2002 | Mouri | 355/53 |
| 6,552,773 B2 | 4/2003 | Emoto | 355/53 |
| 6,580,958 B1 | 6/2003 | Takano | 700/121 |
| 6,616,898 B2 | 9/2003 | Hara et al. | 422/112 |
| 6,753,942 B2 * | 6/2004 | Nagahashi | 355/30 |
| 2002/0097205 A1 * | 7/2002 | Nakamura | 345/82 |

* cited by examiner

Primary Examiner—Henry Hung Nguyen
(74) Attorney, Agent, or Firm—Fitzpatrick, Cella, Harper & Scinto (57) ABSTRACT A device manufacturing apparatus for use in manufacturing a device. The apparatus includes a main booth in which an exposure apparatus is installed, a transport booth in which a mechanism arranged to transfer an object to and/or from the exposure apparatus is installed, an air conditioning booth having a temperature adjusting device which supplies a temperature adjusting gas to the main booth and the transport booth to control temperature therein, a duct through which the temperature adjusting gas at least in the transport booth is recovered to the air conditioning booth, a first component arranged in a space that is outside the duct but inside the main booth to detect a state of a predetermined portion in the space, or to drive or to control the predetermined portion, and a second component arranged in the duct and electrically connected to the first component to receive an electrical signal that pertains to the state of the predetermined portion from the first component, or to supply an electrical signal generated to drive or to control the predetermined portion to the first component.

9 Claims, 7 Drawing Sheets

DEVICE MANUFACTURING APPARATUS

FIELD OF THE INVENTION

The present invention relates to a device manufacturing apparatus such as an exposure apparatus or the like.

BACKGROUND OF THE INVENTION

The lithography process for manufacturing a device such as a semiconductor device uses an exposure apparatus which projects a reticle pattern onto a wafer coated with a photosensitive agent (photoresist) through a projection optical system. Such an exposure apparatus comprises a plurality of units, i.e., a projection lens which projects a reticle pattern, a laser unit which generates exposure light, an illumination system unit which guides the exposure light to the projection lens, a reticle stage which holds a mask and moves it to a predetermined position, a wafer stage which holds a wafer coated with a photosensitive agent and moves it to a predetermined position, an alignment unit for precisely aligning a mask pattern and the wafer, a transport system unit for transporting the mask and wafer to respective stages, a control unit for performing centralized control for the above-mentioned units, and the like.

The exposure apparatus further includes a large number of units, i.e., air pipes for air-floating the respective stages, a piping unit for distributing and controlling coolant system pipes for cooling a heating element whose heat amount is large, such as a linear motor for stage driving, a driving circuit which drives a linear motor or the like, a sensor amplifier which amplifies the output of a sensor, a control board, and the like.

When, e.g., a measurement device for alignment such as an off-axis scope is used to align a wafer with the optical axis of a projection optical system, a measurement error may occur due to a slight change in temperature. The position of a stage movable in a plane perpendicular to the optical axis of the projection lens is measured by a laser interferometer using a bar mirror arranged in the stage. Even a slight change in temperature in the measurement optical path of the laser interferometer causes air fluctuations. As a result, the refractive index of the measurement optical path changes to cause a measurement error. Additionally, the projection lens itself deforms due to heat expansion, thereby degrading the image characteristics.

In order to solve the above-mentioned problems, a semiconductor exposure apparatus performs precise temperature control by an air conditioner so as to keep the temperature in the apparatus constant. The electrical components such as the driving circuit, sensor amplifier, and control board are accommodated in a box, or the like, so as not to leak heat generated in them. By flowing temperature adjusted air in the box, heat is not dissipated outside from the box.

However, if a box which accommodates a driving circuit, sensor amplifier, and control board as described above, and pipes for cooling the box are provided in an exposure apparatus, the size of an exposure apparatus increases.

As for the performance of an exposure apparatus, increases in accelerations as well as synchronization accuracy of a reticle stage and a wafer stage have been demanded to increase the throughput. To meet this demand, there has been proposed a mechanism, in which a counter mass, which moves in a direction opposite to the driving direction of a stage so as not to transmit vibrations generated upon stage driving outside the stage, is provided to receive a reaction force generated upon stage driving. Mounting of this mechanism also increases the size of an exposure apparatus.

In consideration of the footprint of an exposure apparatus in a factory, an increase in size of the apparatus is not desirable, and it is thus difficult to ensure a space for placing the above-mentioned box.

SUMMARY OF THE INVENTION

The present invention has been made in consideration of the above-mentioned background, and has as its object to suppress an increase in size of a device manufacturing apparatus such as an exposure apparatus, and at the same time, to effectively prevent adverse effects caused by heat generation in a component.

According to the present invention, there is provided a device manufacturing apparatus for use in the manufacture of a device, the apparatus comprising a duct for causing a temperature adjusting gas to flow, a first component arranged outside the duct to detect a state of a predetermined portion outside the duct, or to drive or to control the predetermined portion, and a second component arranged in the duct and electrically connected to the first component to receive an electrical signal that pertains to the state of the predetermined portion from the first component, or to supply an electrical signal generated to drive or to control the predetermined portion to the first component. According to the present invention, e.g., mounting the second component in the duct can suppress an increase in size of the device manufacturing apparatus and prevent adverse effects caused by heat generated in the second component.

According to a preferred embodiment of the present invention, the device manufacturing apparatus preferably further comprises a heat-insulating member arranged in the duct.

According to a preferred embodiment of the present invention, preferably, the device manufacturing apparatus further comprises a relay board so arranged as to constitute a part of the duct, and the first and second components are electrically connected to each other through the relay board. A heat-insulating member is preferably placed on at least a part of the relay board.

According to a preferred embodiment of the present invention, preferably, the duct has an opening portion with a shutter, and the first and second components are electrically connected to each other by a cable which extends through the opening portion. The shutter preferably has a stretchable member at a portion where the shutter in a closed state comes into contact with the cable. The stretchable member preferably has a heat-insulating function.

The present invention is particularly useful when the second component generates heat in operation.

According to a preferred embodiment of the present invention, the device manufacturing apparatus can be configured as, e.g., an exposure apparatus.

The present invention can be a device manufacturing method using the above-mentioned device manufacturing apparatus. For example, if the above-mentioned device manufacturing apparatus is configured as an exposure apparatus, the exposure apparatus can be used in an exposure step in a lithography step, including a step of applying a photosensitive agent, the exposure step, a development step, an etching step, and the like.

Other features and advantages of the present invention will be apparent from the following description taken in conjunction with the accompanying drawings, in which like reference characters designate the same or similar parts throughout the figures thereof.

BRIEF DESCRIPTION OF THE DRAWINGS

The accompanying drawings, which are incorporated in and constitute a part of the specification, illustrate embodiments of the invention and, together with the description, serve to explain the principles of the invention.

DETAILED DESCRIPTION OF THE PREFERRED EMBODIMENT

A preferred embodiment of the present invention will be described below with reference to the accompanying drawings.

Figure 1:
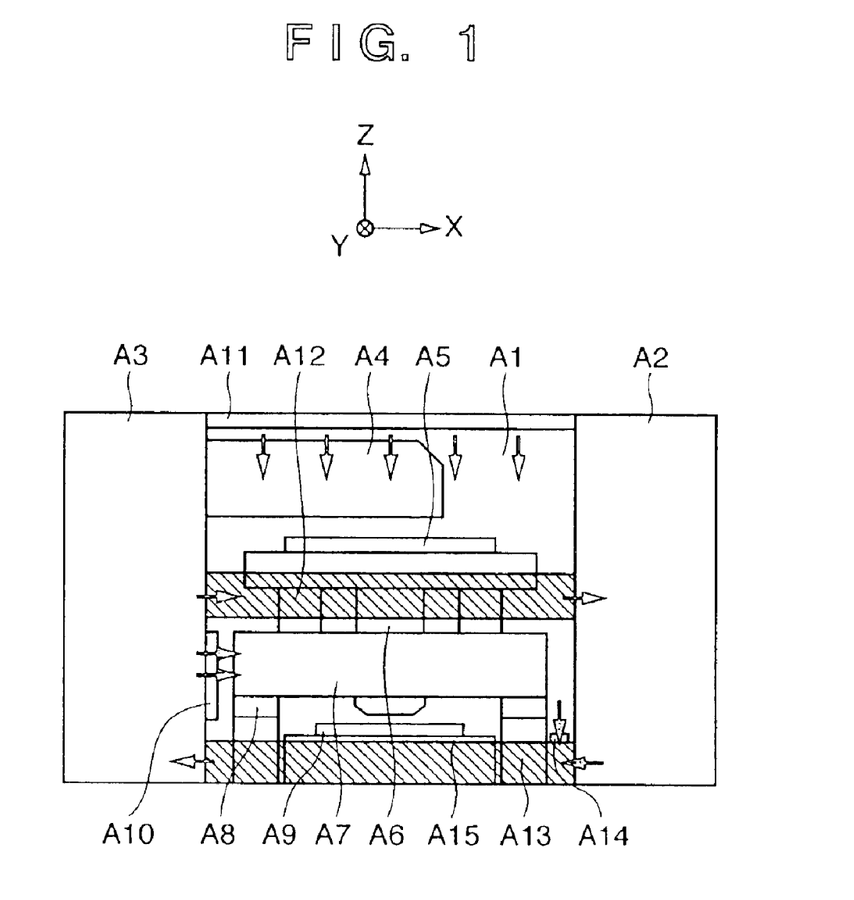
FIG. 1 is a side view showing the schematic arrangement of an exposure apparatus as a device manufacturing apparatus according to a preferred embodiment of the present invention.
Figure 2:
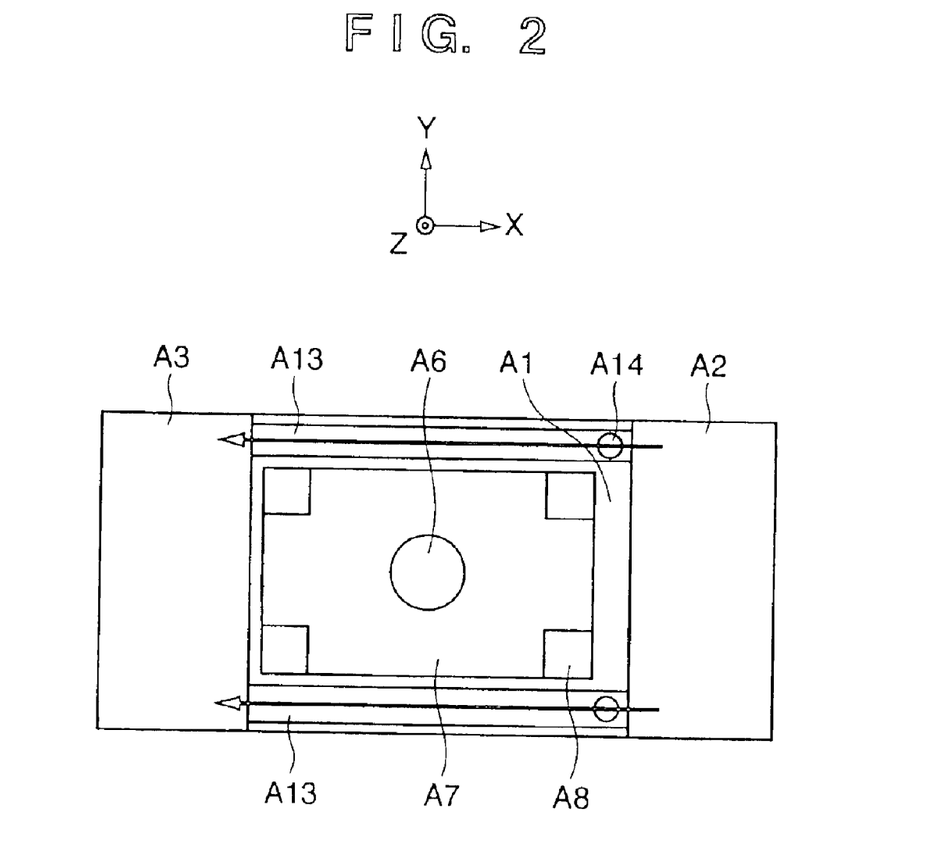
FIG. 2 is a sectional view showing the schematic arrangement of the exposure apparatus as the device manufacturing apparatus according to the preferred embodiment of the present invention.

FIGS. 1 and 2 are views showing the schematic arrangement of an exposure apparatus as a device manufacturing apparatus according to a preferred embodiment of the present invention. FIG. 1 is a side view; and FIG. 2, a sectional view of the lower portion in FIG. 1. This exposure apparatus is used in the exposure step in the manufacture of a device such as a semiconductor device or the like.

The exposure apparatus comprises three booths, i.e., a main body booth A1, a transport booth A2, and an air conditioning booth A3. The main body booth A1 has a basic function of projecting and transferring the pattern of a reticle (master) onto a wafer (substrate) coated with a photosensitive agent. The transport booth A2 has a mechanism for loading the reticle and the wafer coated with the photosensitive agent to the main body booth A1 and unloading the wafer after exposure from the main body booth A1. The transport booth A2 typically has a transport robot, a unit which pre-aligns the reticle and wafer, and the like. The air conditioning booth A3 has a temperature adjusting device, which performs temperature control so as to continuously keep the temperature in the main body booth A1 and transport booth A2 at a constant temperature. Note that the exposure apparatus also comprises a control unit (not shown) for controlling the exposure apparatus, in addition to the above-mentioned components.

Units arranged in the main body booth A1 will be described. An optical system A4 has an optical guide system and an illumination optical system. The optical system A4 guides light into the main body booth A1 to illuminate the reticle (master) with the light. A reticle stage A5 holds the reticle and drives it in the Y direction in an X-Y plane perpendicular to an optical axis. A pattern image of the reticle illuminated by the illumination optical system is projected onto the wafer through a projection lens A6. The wafer is held on a wafer stage A9 and is driven in the X and Y directions in an X-Y plane perpendicular to the optical axis.

The projection lens A6 is supported by a surface plate A7. The surface plate A7 is supported on the floor through a damper A8 for absorbing vibrations of the floor and vibrations generated upon step driving of the wafer stage A9.

Temperature-adjusted air (temperature adjusting air) from the air conditioning booth A3 is supplied into the main body booth A1 through temperature adjusting air outlets A10 and A11. This temperature adjusting air keeps the temperature in the main body booth A1 constant. Air temperature-adjusted in the air conditioning booth A3 is also supplied to the transport booth A2 through an air supply duct A12 and is recovered to the air conditioning booth A3 through exhaust ducts A13. In this manner, the temperature in the transport booth A2 is kept constant. In this embodiment, the exhaust duct A13 is arranged not only to exhaust air in the transport booth A2 but also to recover air in the main body booth A1 through an air inlet A14. Note that a duct for recovering air from the main body booth A1 and a duct for recovering air from the transport booth A2 may separately be provided.

In this embodiment, the number of exhaust ducts A13 is two, and the two exhaust ducts A13 are arranged on the right and left sides (when seen from above), as shown in FIG. 2. Note that each arrow in FIGS. 1 and 2, and 3 and 5 (to be described later) indicates a direction in which air (temperature adjusting gas) flows.

Figure 3:
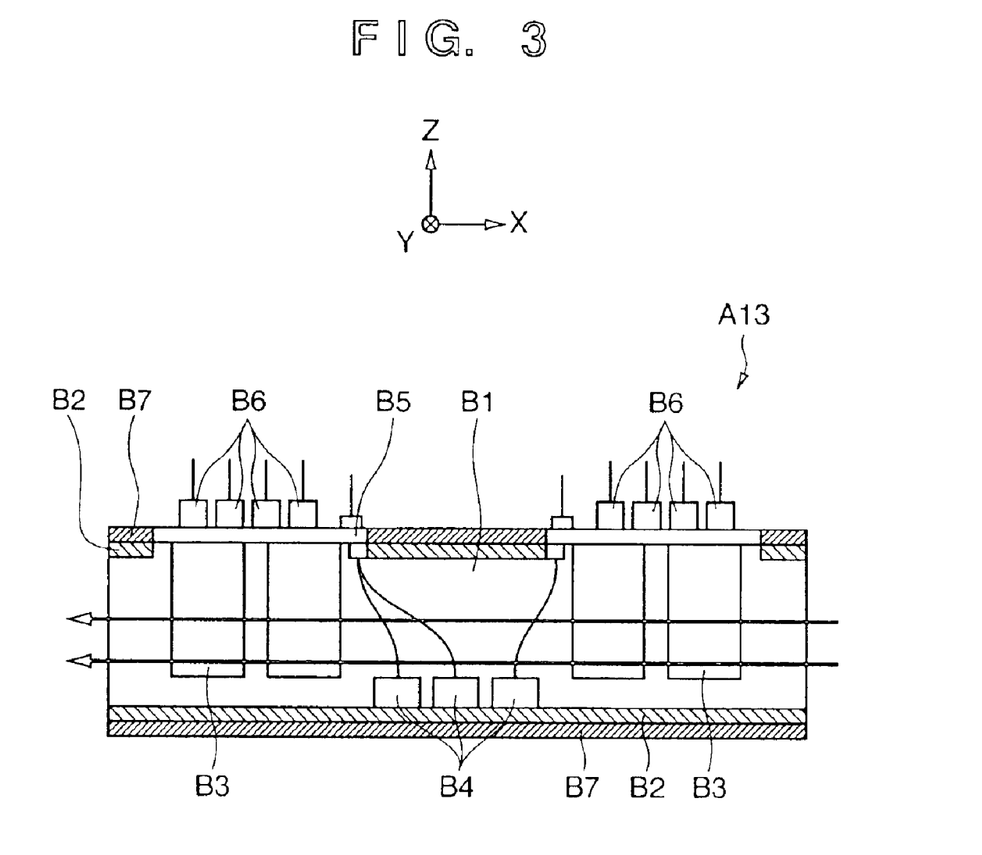
FIG. 3 is a sectional view showing in detail an exhaust duct (A13) shown in FIGS. 1 and 2.
Figure 4:
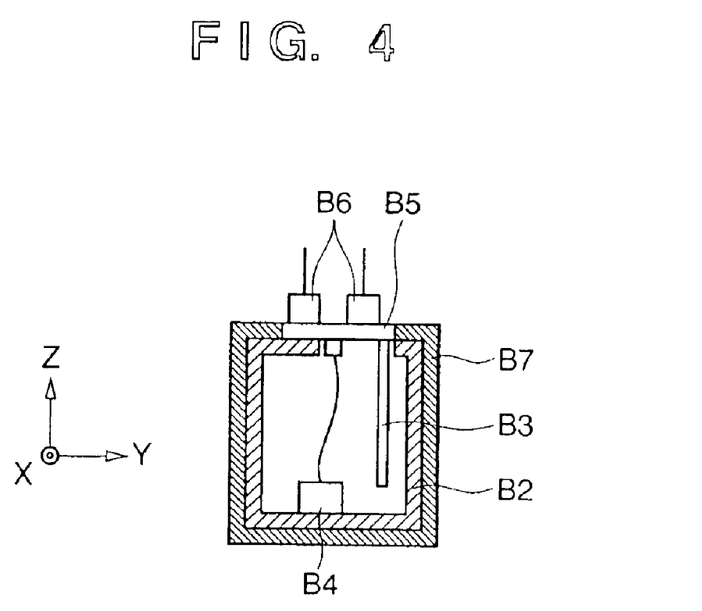
FIG. 4 is a sectional view showing in detail the exhaust duct (A13) shown in FIGS. 1 and 2.

FIGS. 3 and 4 are sectional views showing in detail the exhaust ducts A13 shown in FIGS. 1 and 2. The exhaust duct A13 is preferably formed by placing a heat-insulating member B2 inside a frame B7 which is made of a high-strength material (e.g., a metal). The heat-insulating member B2 is preferably arranged on the entire inner surface of the frame B7. However, the heat-insulating member B2 may be arranged on all or part of the outer surface of the frame B7. The heat-insulating member B2 is thus formed to prevent the air flowing in a space B1 in the exhaust duct A13 from heat transfer outside the exhaust duct A13. Additionally, the heat-insulating member B2 is preferably placed on the inner side or outer side of a relay board B5 (to be described later), if possible.

Second electrical components (second components) B3 and B4 serving as heating elements are arranged in the exhaust duct A13. The second electrical components are electrically connected to first electrical components (first components) arranged outside the exhaust duct A13 so as to receive electrical signals which pertain to the states of predetermined portions of the main body of the exposure apparatus from the first electrical components or supply to the first electrical components electrical signals generated to drive or control the predetermined portions.

The second electrical component B3 is an electrical component such as a circuit board electrically connected to the first electrical component (first component) arranged in the exposure apparatus main body (outside the exhaust duct) in the main body booth A1. Examples of the second electrical component B3 include a board on which a driving circuit for driving a motor (e.g., a linear motor which drives a stage) as the first electrical component is formed, a board on which an input circuit connected to a sensor (e.g., a laser interferometer or measurement device for alignment) as the first electrical component is formed, and the like. Examples of the second electrical component B4 include an amplifier which amplifies an output from the sensor as the first electrical component arranged in the exposure apparatus main body (outside the exhaust duct) in the main body booth A1.

As described above, in the exposure apparatus, the second electrical component such as a circuit board, sensor amplifier, or the like, which is electrically connected to the first electrical component arranged outside the exhaust duct A13, is arranged inside the exhaust duct A13. With this arrangement, an increase in size of the exposure apparatus can be suppressed, and at the same time, adverse effects (e.g., a measurement error of a measurement device for alignment caused by fluctuations in temperature, a stage alignment error caused by fluctuations in temperature of the measurement optical path of a laser interferometer, characteristic variations of a projection lens caused by fluctuations in temperature, and the like) of heat generated in the second electrical component can be reduced.

The first electrical component, e.g., a driving mechanism (a component for driving or controlling a predetermined portion) such as a motor, or a sensor (a component for detecting the state of a predetermined portion) must be typically spaced apart from the exhaust duct A13. Accordingly, a cable needs to be connected from the exhaust duct A13 to the first electrical component. For this purpose, the relay board (relay circuit) B5 is preferably provided in the exhaust duct A13 to connect the second electrical components B3 and B4 in the exhaust duct A13 to the relay board B5, directly or through a connector or the like, and connect a connector B6 arranged outside the relay board B5 to the first electrical component through a cable. The relay board B5 facilitates connection between the second electrical component in the exhaust duct A13 and the first electrical component outside the exhaust duct A13 and maintenance of the exposure apparatus. More specifically, the relay board B5 can put together cables connected to various portions in the exposure apparatus and then cause them to extend into the exhaust duct A13. For example, if a circuit board as the second electrical component B3 is connected to the relay board B5 through a high-density multipolar connector, the number of cables in the exhaust duct A13 can be reduced or the structure in the exhaust duct A13 can be simplified. This structural simplification increases the effective cross-sectional area of the exhaust duct A13 and contributes to increased efficiency of the flow of air (temperature adjusting gas).

When the relay board B5 is so arranged as to seal the exhaust duct A13, the airtightness of the exhaust duct A13 can be improved, and the efficiency of heat exhaust can be increased, for the following reason. The flow rate of air which can be exhausted through the exhaust duct A13 is determined by the cross-sectional area of the exhaust duct A13. When a cable is pulled out from inside the exhaust duct A13 to outside without the relay board B5 or if there is a gap between the relay board B5 and the frame B7, extra air is drawn into the exhaust duct A13 through the gap in the exhaust duct A13. Accordingly, the flow rate of air which contributes to heat exhaust decreases by the amount of the extra air.

Examples of a sensor as the first electrical component include an eddy current displacement gauge for measuring the relative displacement between the damper A8 and the stage surface plate A15, which supports the wafer stage A9, in addition to the above-mentioned components. A measurement error occurs in a sensor such as a displacement gauge or the like due to the length or characteristics of a cable connected to the sensor. For this reason, a sensor (first electrical component) is preferably connected to a sensor amplifier (second electrical component) without mediacy of the relay board, as in the second electrical components B4 of FIGS. 3 and 4. Mains lines and signal lines with high noise resistance are preferably connected through the relay board B5 in order to facilitate wiring or maintenance.

According to the preferred embodiment of the present invention, the exhaust duct A13 is preferably designed as follows. If temperature adjusting air blown from the air conditioning booth A3 is kept at a constant temperature, the difference in temperature between temperature adjusting air blown into the transport booth A2 and air at the connection between the transport booth A2 and the exhaust duct A13 (i.e., the air inlet of the exhaust duct A13) is set to 2.0° C. or less, and the difference in temperature between the inlet of the exhaust duct A13 and its outlet is set to 1.0° C. or less.

Assume that these conditions are satisfied and that the temperature of the temperature adjusting air is set to about 23° C. In this case, the temperature of the air at the inlet of the exhaust duct A13 becomes 25° C. or less, and thus, heat generation in the second electrical components such as the circuit boards, the sensor amplifiers, and the like, in the exhaust duct A13 can sufficiently be suppressed. In addition, under these conditions, a change in temperature in the exhaust duct A13 is about 1° C. Hence, if a change in temperature of about 1° C. is allowed, in, e.g., a measurement device in which a measurement error may be caused by a change in temperature of an electrical component such as a sensor amplifier, the electrical component of the measurement device can be arranged in the exhaust duct A13.

Preferably, the exhaust duct A13 has a removable panel and its interior can be accessed by removing the panel. This structure contributes to facilitation of maintenance such as repair or replacement of electrical components arranged in the exhaust duct A13.

Figure 5:
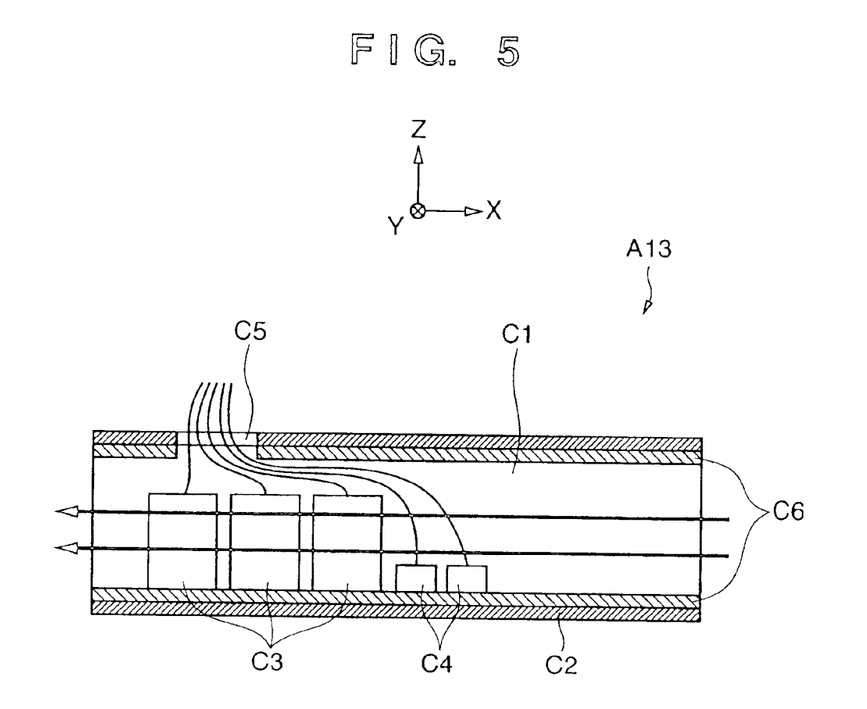
FIG. 5 is a sectional view showing another arrangement of the exhaust duct (A13) shown in FIGS. 1 and 2.

FIG. 5 is a view showing an example of another arrangement of the exhaust duct A13 shown in FIGS. 1 and 2. The arrangement is different from that shown in FIGS. 3 and 4 in a method of guiding cables inside and outside the exhaust duct A13.

The exhaust duct A13 shown in FIG. 5 is preferably formed by placing a heat-insulating member C6 inside a frame C2 made of a high-strength material (e.g., a metal). The heat-insulating member C6 is preferably placed on the entire inner surface of the frame C2. However, the heat-insulating member C6 may be placed on all or part of the outer surface of the frame C2.

Second electrical components C3 and C4 serving as heating elements are arranged in the exhaust duct A13. The second electrical component C3 is an electrical component such as a circuit board electrically connected to the first electrical component arranged in the exposure apparatus main body (outside the exhaust duct A13) in the main body booth A1. Examples of the second electrical component C3 include a board on which a driving circuit for driving a motor (e.g., a linear motor which drives a stage) as the first electrical component is formed, an input circuit connected to a sensor (e.g., a laser interferometer and measurement device for alignment) as the first electrical component, and the like. Examples of the second electrical component C4 include an amplifier which amplifies the output of the sensor as the first electrical component arranged in the exposure apparatus main body in the main body booth A1.

Cables connected to the second electrical components C3 and C4 are directly connected to components of the exposure apparatus through an opening portion C5 formed in the exhaust duct A13 without mediacy of a relay board or relay circuit.

The opening portion C5 is preferably so minimized as to prevent air from flowing into the exhaust duct A13 through the opening portion C5. Alternatively, a shutter structure which closes the opening portion C5 is preferably provided.

Figure 6:
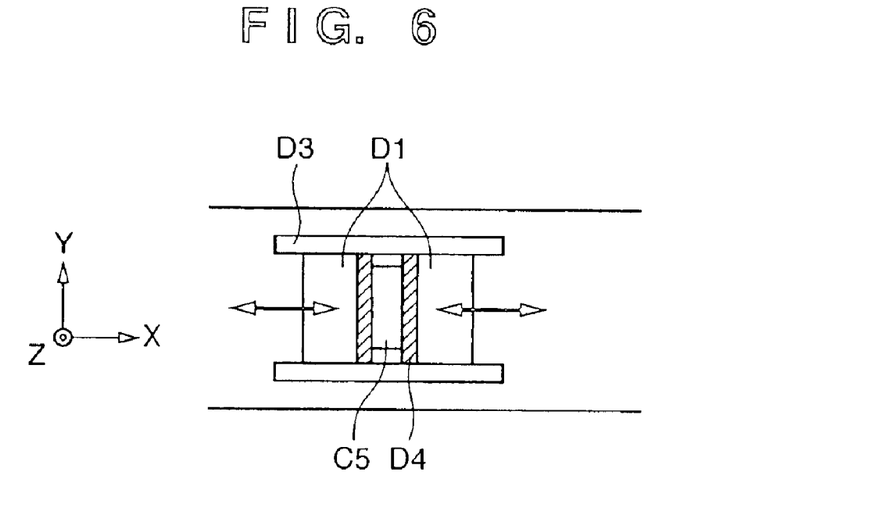
FIG. 6 is a view schematically showing an example of a shutter structure suitably adopted in an opening shown in FIG. 5.

FIG. 6 is a view schematically showing an example of a shutter structure suitably adopted in the opening portion shown in FIG. 5. In this arrangement, two shutter plates (slide panels) D1 are provided. The two shutter plates D1 are slidably guided by a guide D3. Stretchable members D4 are attached to the opposing portions of the two shutter plates D1. The stretchable member D4 is preferably made of a material (e.g., a sponge), which has not only high stretchability, but also high heat insulating properties. A heat insulating member is preferably placed inside or outside the shutter plates D1.

The cables connected to the second electrical components C3 and C4 are pulled out from the exhaust duct A13 through the opening portion C5, and the two shutter plates D1 are so closed as to compress the stretchable member D4. With this arrangement, the opening portion C5 can be closed, and the airtightness of the exhaust duct A13 can be increased.

The arrangement shown in FIG. 6 is effective when the diameter or size of a cross section of a cable is small. If it is large, a clearance is likely to be formed between the shutter plates D1. For this reason, cables are preferably pulled out from inside the exhaust duct A13 to outside through a relay board, as shown in FIGS. 3 and 4.

In the above-mentioned embodiment, the second electrical component (second component) is arranged in the exhaust duct. Instead of this, the second electrical component can be arranged in a supply duct which supplies temperature adjusting air from the temperature adjusting booth to an object to be temperature-adjusted.

Figure 7:
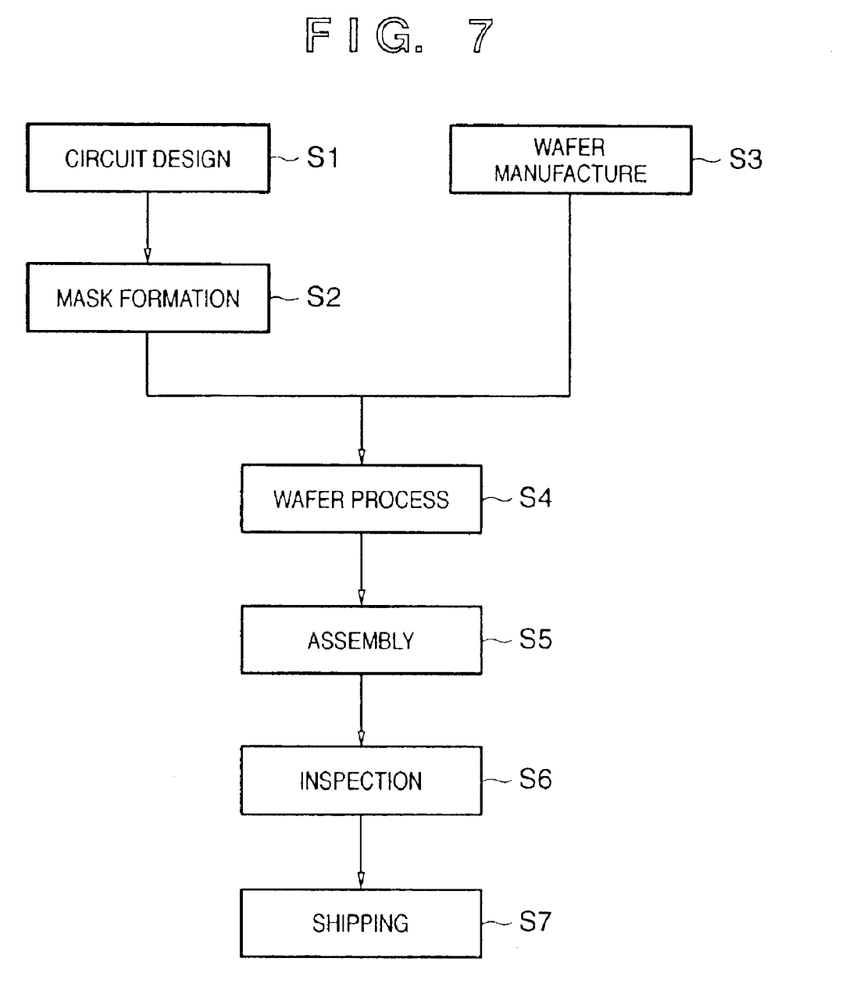
FIG. 7 is a flow chart showing the flow of the whole manufacturing process of a semiconductor device.

The manufacturing process of a semiconductor device using the above-mentioned exposure apparatus will be described next. FIG. 7 shows the flow of the whole manufacturing process of the semiconductor device. In step 1 (circuit design), a semiconductor device circuit is designed. In step 2 (mask formation), a mask having the designed circuit pattern is formed.

In step 3 (wafer manufacture), a wafer is manufactured by using a material such as silicon. In step 4 (wafer process), called a preprocess, an actual circuit is formed on the wafer with the above-mentioned exposure apparatus by lithography using the prepared mask and wafer. Step 5 (assembly), called a post process, is the step of forming a semiconductor chip by using the wafer formed in step 4, and includes an assembly process (dicing and bonding) and a packaging process (chip encapsulation). In step 6 (inspection), the semiconductor device manufactured in step 5 undergoes inspections such as an operation confirmation test and a durability test. After these steps, the semiconductor device is completed and shipped in step 7.

The wafer process of step 4 includes the following steps: an oxidation step of oxidizing the wafer surface; a CVD step of forming an insulating film on the wafer surface; an electrode formation step of forming an electrode on the wafer by vapor deposition; an ion implantation step of implanting ions in the wafer; a resist processing step of applying a photosensitive agent to the wafer; an exposure step of transferring the circuit pattern onto the wafer after the resist processing step using the above-mentioned exposure apparatus; a development step of developing the wafer exposed in the exposure step; an etching step of etching the resist except for the resist image developed in the development step; and a resist removal step of removing an unnecessary resist after etching. These steps are repeated to form multiple circuit patterns on the wafer.

According to the present invention, by arranging the second component in a duct, an increase in size of a device manufacturing apparatus can be suppressed, and adverse effects, which may be caused by heat generated in the second component, can be prevented.

As many apparently widely different embodiments of the present invention can be made without departing from the spirit and scope thereof, it is to be understood that the invention is not limited to the specific embodiments thereof except as defined in the appended claims.

What is claimed is:

1. A device manufacturing apparatus for use in manufacturing a device, said apparatus comprising:
   a main booth in which an exposure apparatus is installed;
   a transport booth in which a mechanism arranged to transfer an object to and/or from the exposure apparatus is installed;
   an air conditioning booth having a temperature adjusting device which supplies a temperature adjusting gas to said main booth and said transport booth to control temperature therein;
   a duct through which the temperature adjusting gas, at least in said transport booth, is recovered to said air conditioning booth;
   a first component, arranged in a space that is outside said duct but inside said main booth, to detect a state of a predetermined portion in the space, or to drive or to control the predetermined portion; and
   a second component arranged in said duct and electrically connected to said first component to receive an electrical signal that pertains to the state of the predetermined portion from said first component, or to supply an electrical signal generated to drive or to control the predetermined portion to said first component.

2. The apparatus according to claim 1, further comprising a heat-insulating member arranged in said duct.

3. The apparatus according to claim 1, further comprising a relay board arranged so as to constitute a part of said duct, wherein said first and second components are electrically connected to each other through the relay board.

4. The apparatus according to claim 3, wherein a heat-insulating member is placed on at least a part of the relay board.

5. The apparatus according to claim 1, wherein said duct has an opening portion with a shutter, and said first and second components are electrically connected to each other by a cable which extends through the opening portion.

6. The apparatus according to claim 1, wherein said second component generates heat in operation.

7. A device manufacturing method comprising:
   a step of applying a photosensitive agent to a substrate;
   a step of transferring a pattern onto the substrate using a device manufacturing apparatus serving as an exposure apparatus, as defined in claim 1; and
   a step of developing the substrate.

8. A device manufacturing apparatus for use in manufacturing a device, said apparatus comprising:
   a duct through which a temperature adjusting gas flows;
   a first component arranged outside said duct to detect a state of a predetermined portion outside said duct, or to drive or to control the predetermined portion; and a second component arranged in said duct and electrically connected to said first component to receive an electrical signal that pertains to the state of the predetermined portion from said first component, or to supply an electrical signal generated to drive or to control the predetermined portion to said first component, wherein said duct has an opening portion with a shutter, said first and second components are electrically connected to each other by a cable which extends through the opening portion, and the shutter has a stretchable member at a portion where the shutter in a closed state comes into contact with the cable.

9. The apparatus according to claim 8, wherein the stretchable member has a heat-insulating function.

* * * * *